United States Patent
Park

(10) Patent No.: US 8,258,003 B2
(45) Date of Patent: Sep. 4, 2012

(54) MANUFACTURING METHOD OF COMPOUND SEMICONDUCTOR SOLAR CELL

(75) Inventor: Rae-Man Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/023,030

(22) Filed: Feb. 8, 2011

(65) Prior Publication Data

US 2012/0094428 A1 Apr. 19, 2012

(51) Int. Cl.
*H01L 21/00* (2006.01)
(52) U.S. Cl. .................. 438/95; 257/E31.008
(58) Field of Classification Search .............. 438/93, 438/95, 102; 257/E31.008
See application file for complete search history.

(56) References Cited

U.S. PATENT DOCUMENTS

| 6,258,620 B1 * | 7/2001 | Morel et al. ............... 438/57 |
| 2010/0024731 A1 | 2/2010 | Eristoff et al. |
| 2011/0017283 A1 * | 1/2011 | Kampmann et al. ......... 136/252 |
| 2011/0226336 A1 * | 9/2011 | Gerbi et al. ................ 136/262 |

FOREIGN PATENT DOCUMENTS

| GB | 2 181 461 A | 4/1987 |
| KR | 10-0933193 | 12/2009 |

* cited by examiner

*Primary Examiner* — William D Coleman
*Assistant Examiner* — Christine Enad
(74) *Attorney, Agent, or Firm* — Rabin & Berdo, P.C.

(57) ABSTRACT

Provided is a manufacturing method of a compound semiconductor solar cell. The method includes; preparing a substrate on which a back electrode is disposed, and sputtering a metal target to form a copper indium gallium selenium (CIGS) thin film on the back electrode under an indium (In) deposition gas atmosphere.

13 Claims, 3 Drawing Sheets

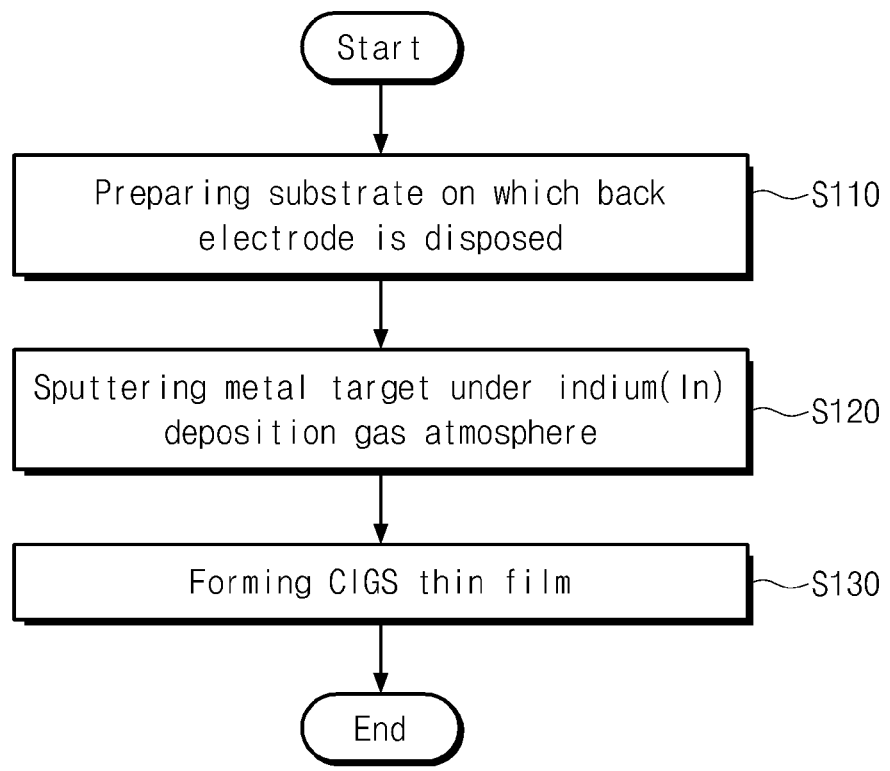
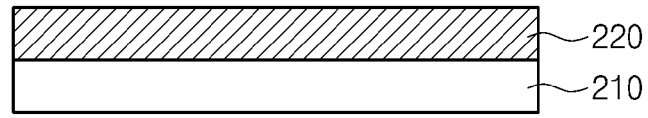

MANUFACTURING METHOD OF COMPOUND SEMICONDUCTOR SOLAR CELL

CROSS-REFERENCE TO RELATED APPLICATIONS

This U.S. non-provisional patent application claims priority under 35 U.S.C. §119 of Korean Patent Applications No. 10-2010-0100948, filed on Oct. 15, 2010, the entire contents of which are hereby incorporated by reference.

BACKGROUND

The present disclosure herein relates to a manufacturing method of a compound semiconductor solar cell, and more particularly, to a manufacturing method of a compound semiconductor solar cell having an optical absorption layer of a high-grade copper indium gallium selenium (CIGS) thin film.

A solar cell or a photovoltaic cell is a core device of a photovoltaic system which directly converts solar light to electricity. When the solar light, which has a larger energy than the band-gap energy ($E_g$) of a semiconductor, is incident on a solar cell manufactured with a p-n junction semiconductor, electron-hole pairs are generated. Subsequently, electrons are gathered to an n-layer and holes are gathered to a p-layer, thus generating a photovoltage between the p-layer and the n-layer. At this time, a current will flow if a load is connected to both ends of electrodes. This is an operating principal of a solar cell.

Among the materials used for manufacturing a solar cell, since I-III-VI$_2$ group chalcopyrite-based compound semiconductors represented by CuInSe$_2$ have a direct transition type energy bandgap and also have about $1 \times 10^5$ cm$^{-1}$ of an optical absorption coefficient which is the highest value among semiconductors, even about 1-2 μm thickness of a thin film can be manufactured into a highly efficient solar cell, and these compound semiconductors have characteristics of very good electro-optical stability in the long term. Therefore, compound semiconductors may substitute a high-priced crystalline silicon solar cell such that these are focused as materials for a low-priced and highly efficient solar cell which can radically improve the economy of a photovoltaic system.

A CIGS thin film solar cell has high efficiency and excellent stability such that it was first studied for a highly efficient lightweight solar cell in space applications capable of replacing a typical single crystal silicon solar cell (20 W/kg). The power generation amount per unit weight is also about 100 W/kg currently in single junction, which is extremely superior to about 20-40 W/kg of typical silicon (Si) or gallium arsenide (GaAs) solar cell.

SUMMARY

The present disclosure provides a manufacturing method of a compound semiconductor solar cell which can form a high-grade copper indium gallium selenium (CIGS) optical absorption layer by a simple single process as well as applying typical semiconductor mass production technologies.

Embodiments of the inventive concept provide manufacturing methods of a compound semiconductor solar cell, the methods including: preparing a substrate on which a back electrode is disposed; and sputtering a metal target to form a CIGS thin film on the back electrode under an indium (In) deposition gas atmosphere.

In some embodiments, the metal target may be one of copper (Cu), copper/gallium (Ga) or copper/gallium/selenium (Se).

In other embodiments, the indium deposition gas may use a gas generated by heating In metal at a temperature ranging from about 700° C. to about 1000° C. flowing the In metal with a flux ranging from about 10 A/sec to about 100 A/sec or generated by heating organometallic indium at a temperature ranging from about 30° C. to about 100° C.

In still other embodiments, the organometallic indium may be trimethyl indium.

In even other embodiments, the indium deposition gas may be supplied by heating the In metal or the organometallic indium inside a reactor where the CIGS thin film is formed.

In yet other embodiments, after forming an indium gas by heating the In metal or the organometallic indium outside a reactor where the CIGS thin film is formed, the indium deposition gas may be supplied by flowing the indium gas through a duct using a carrier gas.

In further embodiments, during using the metal target of Cu or Cu/Ga, selenium may be supplied by a separate selenium supplying apparatus inside a reactor where the CIGS thin film is formed.

In still further embodiments, the sputtering may be performed at a substrate temperature ranging from about 350° C. to about 550° C.

In even further embodiments, a content of Ga contained in the Cu/Ga or the Cu/Ga/Se may range from about 20 atom % to about 30 atom % of a total content.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 1 is a flowchart illustrating a manufacturing method of a copper indium gallium selenium (CIGS) optical absorption layer according to an embodiment of the inventive concept;

FIGS. 2A through 2D are cross-sectional views illustrating a manufacturing method of a CIGS solar cell according to an embodiment of the inventive concept.

DETAILED DESCRIPTION OF THE EMBODIMENTS

Figure 2B:
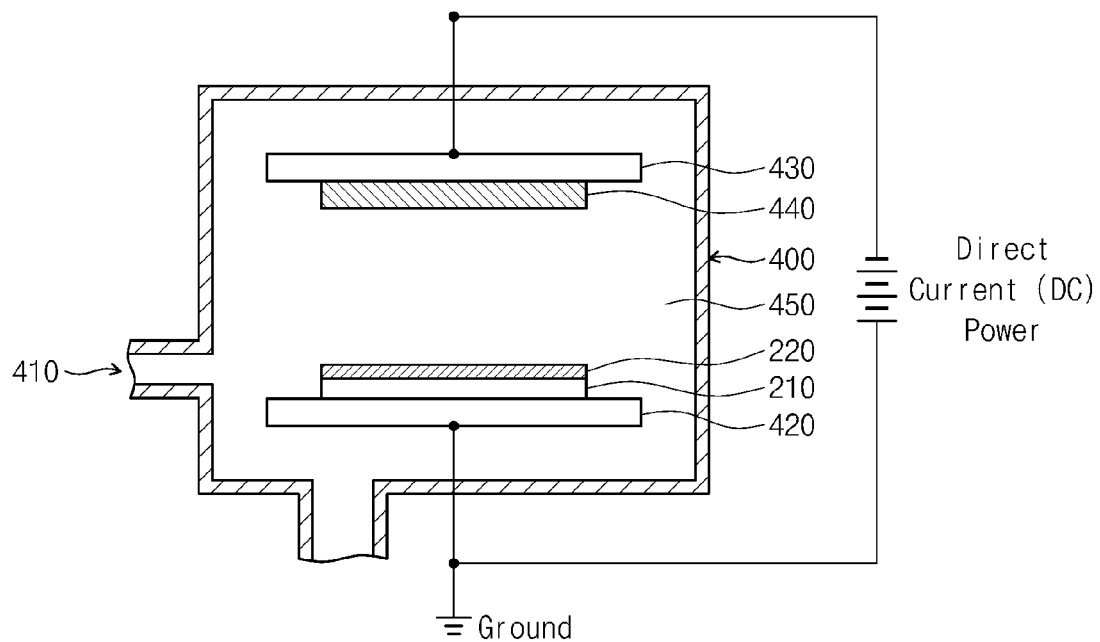

Preferred embodiments of the present invention will be described below in more detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals refer to like elements throughout.

Figure 2C:
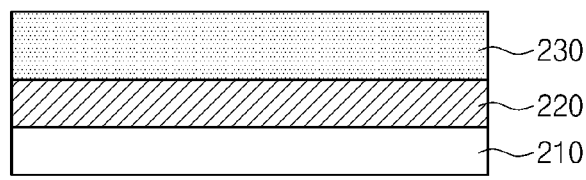
Figure 2D:
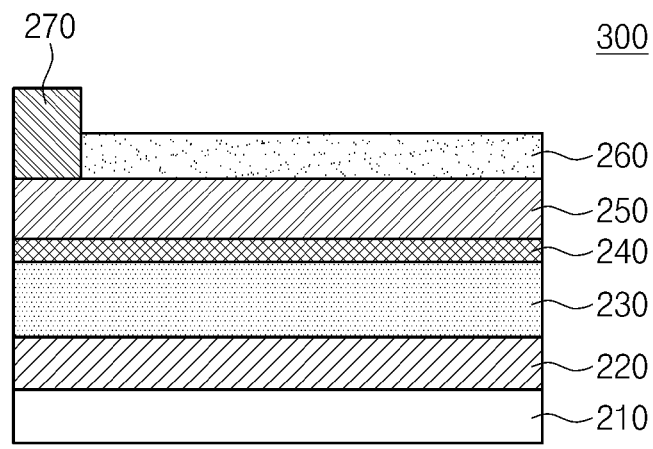
Figure 3:
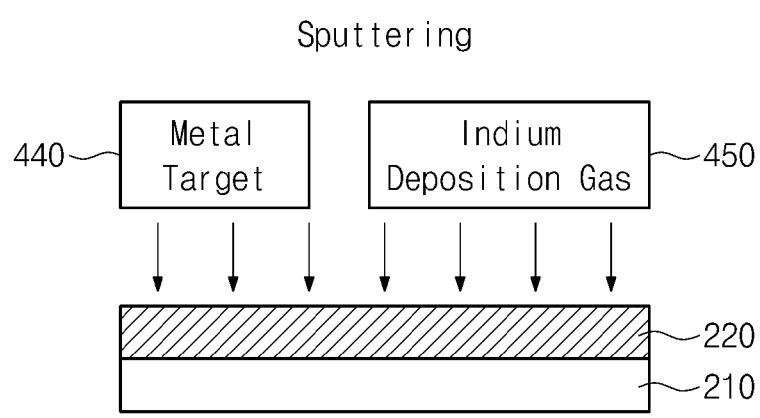
FIG. 3 is a cross-sectional view schematically illustrating a manufacturing method of a CIGS optical absorption layer according to an embodiment of the inventive concept.

FIG. 1 is a flowchart illustrating a manufacturing method of a copper indium gallium selenium (CIGS) optical absorption layer according to an embodiment of the inventive concept, FIGS. 2A through 2D are cross-sectional views illustrating a manufacturing method of a CIGS solar cell according to an embodiment of the inventive concept, and FIG. 3 is a cross-sectional view schematically illustrating a manufacturing method of a CIGS optical absorption layer according to an embodiment of the inventive concept.

Referring to FIGS. 1 and 2A, in operation S110, a substrate 210, on which a back electrode 220 is disposed, is prepared.

The substrate 210 may include glass, ceramic, metal and polymer. Preferably, the substrate 210 may be low cost sodalime glass.

The back electrode 220 has high electrical conductivity and may be composed of a material in excellent ohmic contact with a CIGS thin film 230 (see FIG. 2C). The back electrode 220, for example, may be molybdenum (Mo).

The thin film composed of Mo should have low resistivity as an electrode, and also adhesion on the substrate 210 should be excellent so that an exfoliation phenomenon does not occur due to the difference in thermal expansion coefficients.

The back electrode 220 may be formed by sputtering method, for example, a typical direct current (DC) sputtering method.

Referring to FIGS. 1, 2B, 2C and 3, in operation S120, a metal target 440 is sputtered on the back electrode 220 under an indium (In) deposition gas 450 atmosphere.

The indium deposition gas 450 may use a gas generated by heating In metal at a temperature ranging from about 700° C. to about 1000° C. flowing the In metal with a flux ranging from about 10 A/sec to about 100 A/sec inside a reactor 400 where reactions occur, or generated by heating organometallic indium such as trimethyl indium or the like at a temperature ranging from about 30° C. to about 100° C.

Alternatively, an indium gas is generated by heating In metal at a temperature ranging from about 700° C. to about 1000° C. flowing the In metal with a flux ranging from about 10 A/sec to about 100 A/sec outside a reactor 400, or generated by heating organometallic indium such as trimethyl indium or the like at a temperature ranging from about 30° C. to about 100° C., and subsequently, the indium deposition gas 450 may be supplied by flowing the indium gas into the reactor 400 through a duct 410 using an inert gas like argon (Ar) as a carrier gas.

The metal target 440, which is a raw material of a layer desired to be formed, is installed on a cathode 430. Herein, the metal target 440 may be a single metal or a mixed precursor target.

The metal target 440, for example, may be one of copper (Cu), copper/Gallium (Ga) or copper/gallium/selenium (Se). But, a content of Ga contained in the mixed precursor target may range from about 20 atom % to about 30 atom % of a total content.

If the metal target 440 does not contain selenium, selenium may be separately supplied to the inside of the reactor 400 using a selenium supplying apparatus (not shown) during sputtering the metal target 440.

A direct current (DC) power is applied to a substrate heater such that the sputtering may be performed at about 350-550° C. of a substrate temperature.

Therefore, in operation S130, each of particles reacts under the indium deposition gas 450 atmosphere while sputtering the metal target 440, thereby forming a CIGS thin film 230 composed of $CuIn_xGa_{1-x}Se_2$ (where, 0<x<1) on the back electrode 220 stably placed on a substrate holder 420.

The CIGS thin film 230 is used as an optical absorption layer of a solar cell. The CIGS thin film 230 will be a p-type semiconductor.

In general, the melting of In is about 156° C. which is low such that sputtering is very difficult. Although the melting point of Ga is about 28° C. which is very low, there is no problem of sputtering if a small amount of Ga ranging from about 20 atom % to 30 atom % is mixed into Cu to use as a mixed target. However, when considering a composition ratio of a CIGS thin film, since the amount of In should be between about 70% and about 80% even if In is mixed with Cu to manufacture a mixed target, the problem of a low melting point is not able to be solved. As a result, there are disadvantages that high-speed and large-area depositions are difficult.

However, according to the inventive concept, the indium is supplied not from a sputtering target but from a deposition gas, and the CIGS thin film 230 is formed by sputtering of the metal target 440 not containing the indium.

Therefore, a high-grade CIGS optical absorption layer may be formed by a simple single process using a typical sputtering method without a general post-heat treatment of precursors, and additionally, high-speed and larger-area depositions of the CIGS thin film 230 are possible such that mass production is easy.

Moreover, if the metal target 440 is sputtered under a deposition gas atmosphere, sufficient reactions can occur at a temperature less than about 400° C. so that the effect of manufacturing cost reduction can be obtained by eliminating a typical high-temperature deposition process of more than about 550° C.

Referring to FIG. 2D, a buffer layer 240, a front transparent electrode 250 and an anti-reflection layer 260 are sequentially stacked on the CIGS thin film 230, and a grid electrode 270 is disposed at one side face of the anti-reflection layer 260, thereby completing a CIGS thin-film solar cell 300.

The front transparent electrode 250 is an n-type semiconductor, which functions as a transparent electrode in front side of the solar cell 300 such that this may be composed of a material having high optical transmittance and excellent electrical conductivity. The front transparent electrode 250, for example, may be formed of a ZnO thin film or ZnO thin film/ITO thin film. The front transparent electrode 250 may be formed using a radio frequency (RF) sputtering method, a reactive sputtering method, a metal organic chemical vapor deposition method and the like.

The buffer layer 240 may be composed of a material having a bandgap positioned between the CIGS thin film 230 and the ZnO thin film for making a good junction between the CIGS thin film 230 which is a p-type semiconductor and a front transparent electrode including a ZnO thin film which is an n-type semiconductor used as a window layer. For example, the buffer layer 240 may be composed of a CdS or an $In_xSe_y$ thin film. The CdS thin film may be formed using a chemical bath deposition (CBD) method. The $In_xSe_y$ thin film may be formed using physical deposition methods, for example, a co-evaporation method, a sputtering method and the like.

The anti-reflection layer 260, which is for reducing the reflection loss of incident solar light in the solar cell 300, may be composed of, for example, $MgF_2$. The anti-reflection layer 260 may be formed using a physical deposition method, for example, an e-beam evaporation method.

The grid electrode 270, which is for collecting current on the surface of the solar cell 300, may be composed of, for example, aluminum (Al) or nickel (Ni)/Al.

According to the embodiments of the inventive concept, the high-grade CIGS thin film 230 as an optical absorption layer is included so that the high-grade CIGS thin-film solar cell 300 is possible to be achieved.

According to the embodiments of the inventive concept, indium, which is difficult to sputter due to its low melting point, is supplied not from a sputtering target but from a deposition gas. Therefore, a high-grade CIGS optical absorption layer can be formed by a simple single process using a typical sputtering method without a post-heat treatment of precursors, and additionally, high-speed and larger-area depositions of the CIGS thin film are possible such that mass production is easy. Also, since the metal target is sputtered under a deposition gas atmosphere, the deposition of the CIGS thin film is possible at a temperature less than about 400° C. so that a manufacturing cost can be reduced by eliminating a high-temperature deposition process of more than about 550° C.

While this inventive concept has been particularly shown and described with reference to preferred embodiments thereof, it will be understood by those skilled in the art that various changes in form and details may be made therein without departing from the spirit and scope of the inventive concept as defined by the appended claims. The preferred embodiments should be considered in descriptive sense only and not for purposes of limitation. Therefore, the scope of the inventive concept is defined not by the detailed description of the inventive concept but by the appended claims, and all differences within the scope will be construed as being included in the present inventive concept.

What is claimed is:

1. A manufacturing method of a compound semiconductor solar cell, the method comprising:
    preparing a substrate on which a back electrode is disposed;
    providing an indium (In) deposition gas atmosphere; and
    sputtering a metal target to form a copper indium gallium selenium (CIGS) thin film on the back electrode under the indium (In) deposition gas atmosphere, wherein, while the sputtering, each particle sputtered from the metal target and the indium contained in the indium (In) deposition gas atmosphere react with each other.

2. The method of claim 1, wherein the metal target is copper (Cu), copper/gallium (Ga) or copper/gallium/selenium (Se).

3. The method of claim 2, wherein the metal target is Cu or Cu/Ga, and during using the metal target of Cu or Cu/Ga, selenium is supplied by a separate selenium supplying apparatus inside a reactor where the CIGS thin film is formed.

4. The method of claim 2, wherein the metal target is Cu/Ga or Cu/Ga/Se, and a content of Ga contained in the Cu/Ga or the Cu/Ga/Se ranges from about 20 atom % to about 30 atom % of a total content.

5. The method of claim 1, wherein the indium deposition gas uses a gas generated by heating indium metal at a temperature ranging from about 700° C. to about 1000° C. flowing the indium metal with a flux ranging from about 10 A/sec to about 100 A/sec or generated by heating organometallic indium at a temperature ranging from about 30° C. to about 100° C.

6. The method of claim 5, wherein the organometallic indium is trimethyl indium.

7. The method of claim 5, wherein the indium deposition gas is supplied by heating the indium metal or the organometallic indium inside a reactor where the CIGS thin film is formed.

8. The method of claim 5, wherein, after forming an indium gas by heating the indium metal or the organometallic indium outside a reactor where the CIGS thin film is formed, the indium deposition gas is supplied by flowing the indium gas through a duct using a carrier gas.

9. The method of claim 1, the sputtering is performed at a substrate temperature ranging from about 350° C. to about 550° C.

10. The method of claim 1, wherein the metal target is disposed spaced apart from the back electrode and a space between the metal target and the back electrode is filled with the indium (In) deposition gas atmosphere.

11. The method of claim 1, wherein the indium contained in the CIGS thin film comes from the indium (In) deposition gas atmosphere.

12. The method of claim 1, wherein the metal target does not include indium therein, and the indium contained in the CIGS thin film does not come from the metal target.

13. The method of claim 1, further comprising forming a buffer layer on the CIGS thin film.

* * * * *